United States Patent [19]
Gonzalez

[11] Patent Number: 5,753,947
[45] Date of Patent: May 19, 1998

[54] VERY HIGH-DENSITY DRAM CELL STRUCTURE AND METHOD FOR FABRICATING IT

[75] Inventor: Fernando Gonzalez, Boise, Id.

[73] Assignee: Micron Technology, Inc., Boise, Id.

[21] Appl. No.: 390,295

[22] Filed: Jan. 20, 1995

[51] Int. Cl.$^6$ .................................................. H01L 29/76
[52] U.S. Cl. .................... 257/296; 257/302; 257/308; 257/314; 257/332
[58] Field of Search ......................... 257/296, 302, 257/308, 314, 322

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |

(List continued on next page.)

FOREIGN PATENT DOCUMENTS

| | | | |
|---|---|---|---|
| 0 117 045 | 8/1984 | European Pat. Off. | H01L 45/00 |
| 60109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Polycrystalline Silicon Diode with n–type Region Heavily Doped with Both Boron and Phosphorous," *J. Appl. Phys.*, 53(7):5359–5360, 1982.
Neale and Aseltine, "The Application of Amorphous Materials to Computer Memories," *IEEE*, 20(2):195–205, 1973.
Pein and Plummer, "Performance of the 3–D Sidwall Flash EPROM Cell," *IEEE*, 11–14, 1993.
Post and Ashburn, "Investigation of Boron Diffusion in Polysilicon and its Application to the Design of p–n–p Polysilicon Emitter Bipolar Transistors with Shallow Emitter Junctions," *IEEE* 38(11):2442–2451, 1991.
Post et al., "Polysilicon Emitters for Bipolar Transistors: A Review and Re–Evaluation of Theory and Experiment," *IEEE*, 39(7):1717–1731, 1992.
Post and Ashburn, "The Use of an Interface Anneal to Control the Base Current and Emitter Resistance of p–n–p Polysilicon Emitter Bipolar Transistors," *IEEE*, 13(8):408–410, 1992.
Rose et al., "Amorphous Silicon Analogue Memory Devices," *J. Non–Crystalline Solids*, 115:168–170, 1989.
Schaber et al., "Laser Annealing Study of the Grain Size Effect in Polycrystalline Silicon Schottky Diodes," *J. Appl. Phys.*, 53(12):8827–8834, 1982.
Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.
Yeh et al., "Investigation of Thermal Coefficient for Polycrystalline Silicon Thermal Sensor Diode," *Jpn. J. Appl. Phys.*, 31(Part 1, No. 2A):151–155, 1992.
Oakley et al., "Pillars –The Way to Two Micron Pitch Multilevel Metallisation," *IEEE*, 23–29, 1984.

*Primary Examiner*—Edward Wojciechowicz
*Attorney, Agent, or Firm*—Fletcher & Associates

[57] ABSTRACT

A vertical transistor semiconductor and method of making a vertical transistor is provided. The vertical transistor is particularly suited for use in a DRAM cell. The structure permits a DRAM cell to be fabricated with a comparatively low number of masking layers. Moreover, the vertical nature of the transistor allows a larger number of transistors per surface area compared to conventional techniques. The method and apparatus also utilizes a buried digit line. The digit line may include a portion that is a metal material that in a preferred embodiment is step-shaped sidewall of the digit line. The transistor is particular suited for use with a variety of DRAM capacitors.

20 Claims, 24 Drawing Sheets

U.S. PATENT DOCUMENTS

| | | | |
|---|---|---|---|
| 4,203,123 | 5/1980 | Shanks | 357/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,502,208 | 3/1985 | McPherson | 29/584 |
| 4,569,698 | 2/1986 | Feist | 148/1.5 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/296 |
| 5,510,629 | 4/1996 | Karpovich et al. | 257/50 |

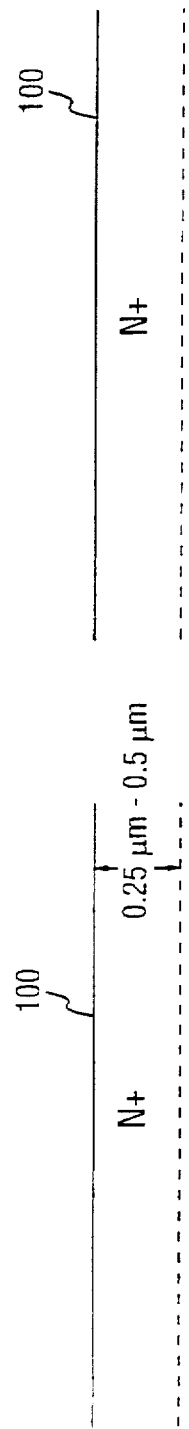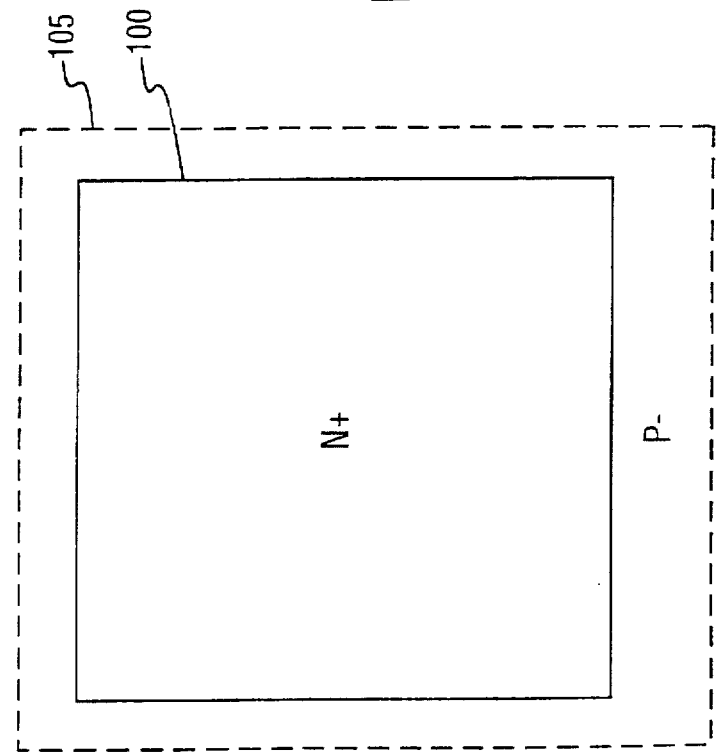

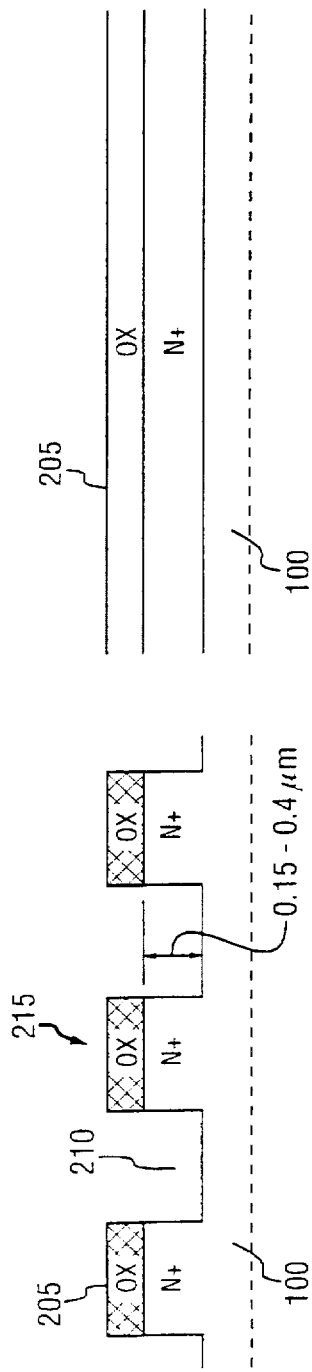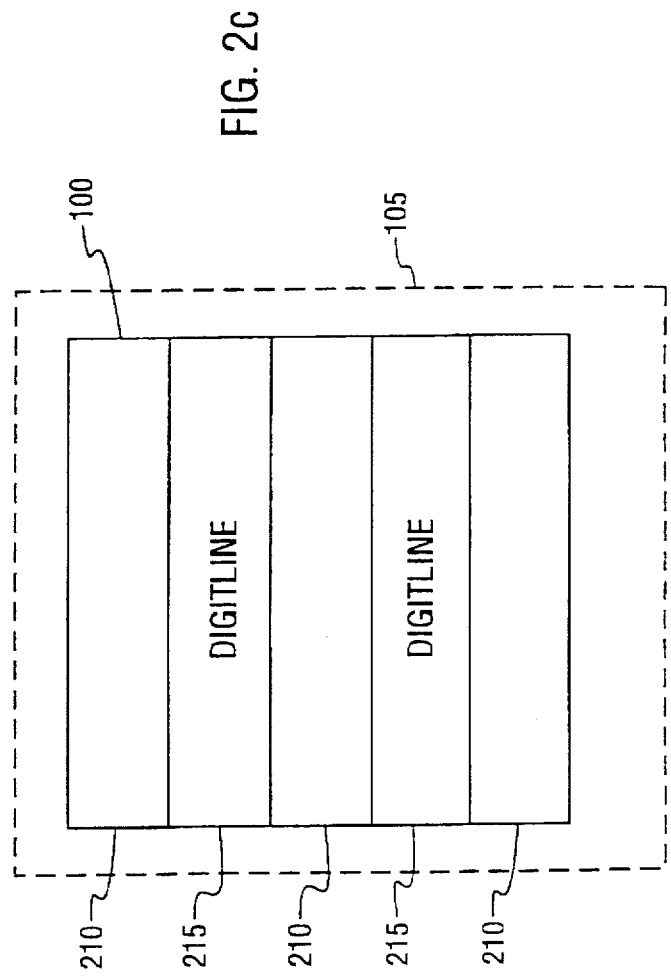

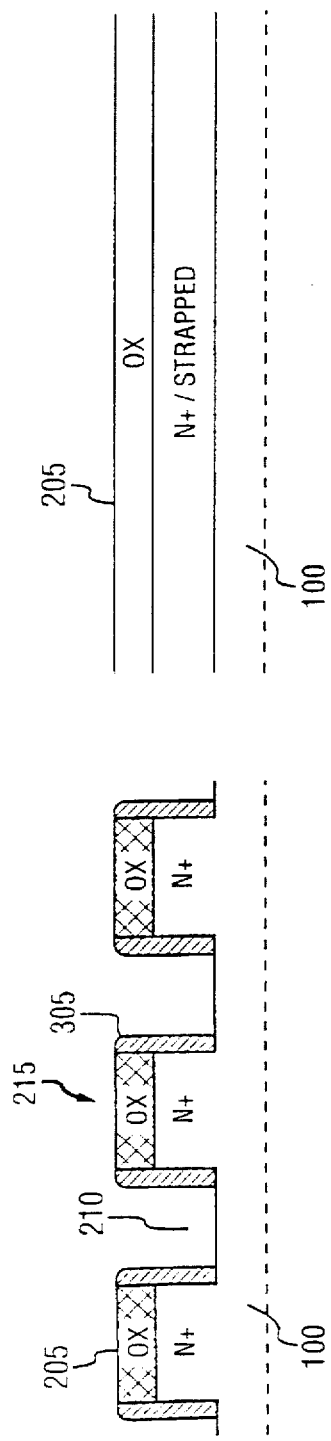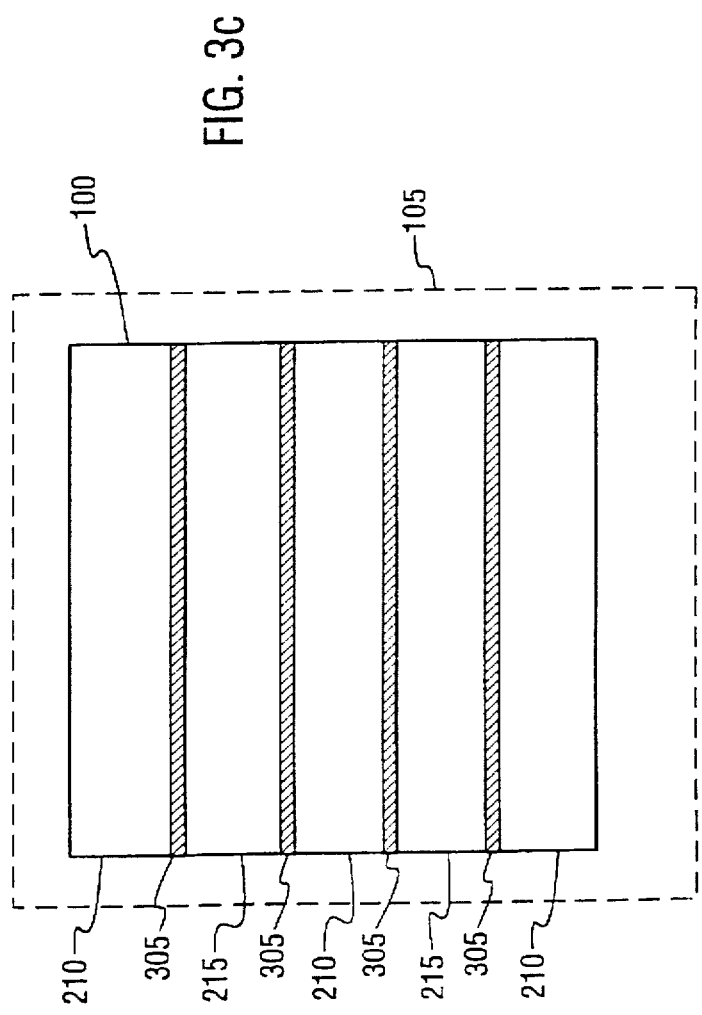

$D \approx W/2 + 1000 \text{ Å}$

1

VERY HIGH-DENSITY DRAM CELL STRUCTURE AND METHOD FOR FABRICATING IT

BACKGROUND OF THE INVENTION

The invention relates to a very high-density DRAM (dynamic random access memory) cell or other semiconductor structure having a series of vertically oriented access transistors (sometimes referred to as transfer gate transistors, and associated capacitors or other components. Many known prior art devices required a horizontal transistor and a storage node on each side of the transistor. As a result, the surface area or "real estate" of the silicon was not optimally used.

SUMMARY OF THE INVENTION

A vertical transistor semiconductor and method of making a vertical transistor is provided. The vertical transistor is particularly suited for use in a DRAM cell, however, the present invention may be utilized in a wide range of devices, particularly those in which a vertical access transistor and a cross-point array would be desirable. The structure permits a DRAM cell to be fabricated with a comparatively low number of masking layers. For example, embodiments utilizing only four or five masking layers are disclosed. Moreover, the vertical nature of the transistor allows a larger number of transistors per surface area compared to conventional techniques. The method and apparatus also utilizes a buried digit line. The digit line may include a portion that is a metal material that in a preferred embodiment is step-shaped sidewall of the digit line. The transistor is particular suited for use with a variety of DRAM capacitors.

The present invention may include forming vertical transistors utilizing buried digit line. The digit lines may be isolated from one another by a dielectric filled trench. A portion of the digit line may include a refractory material. Preferably, the refractory material is formed in a step-shaped sidewall of the buried digit line. The refractory material provides a lowered resistance for the digit line.

The present invention may also include utilizing a plurality of word lines by forming an epitaxial layer above the digit lines. The epitaxial layer may have alternating highly and lightly doped regions, for example $P^+$ and $P^-$ regions. A portion of the epitaxial layer may also be highly doped, for example $N^+$, to form a storage node. An oxide is thermally grown adjacent the epitaxial layer to form a gate oxide.

BRIEF DESCRIPTION OF DRAWINGS

The majority of the Figures below are views of a silicon wafer at successive stages of a process for fabricating a cell structure in accordance with the invention. In the Figures, three views are shown and labeled as follows: (a) A cross section of the digit line of the cell structure in the array area, (b) a cross section of the word line of the array area, and (c) a top view. Figures without an (a), (b), or (c) label are of the digit line cross section. The Figures in question are FIGS. 1(a), 1(b), and 1(c); FIGS. 2(a), 2(b), and 2(c); FIGS. 3(a), 3(b), and 3(c)

DETAILED DESCRIPTION OF SPECIFIC EMBODIMENTS

Figure 4:
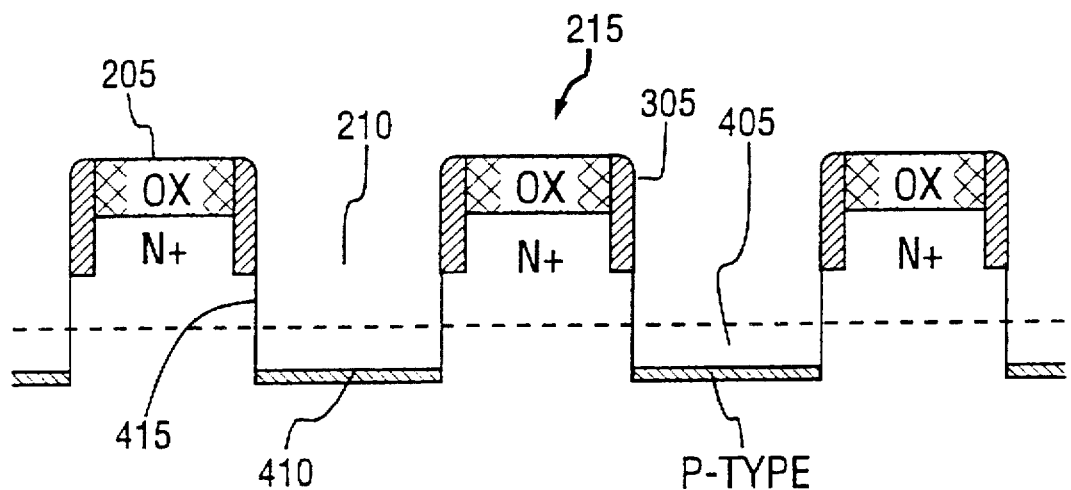
FIGS. 4, 5, and 6.

Some illustrative embodiments of the invention are described below. It will of course be appreciated that in the design of any such actual implementation (as in any semiconductor design project), numerous implementation-specific decisions must be made to achieve the designers' specific goals, such as compliance with manufacturing- and business-related constraints, which will vary from one implementation to another. Moreover, it will be appreciated that such a design effort might be complex and time-consuming, but would nevertheless be a routine undertaking of semiconductor engineering for those of ordinary skill having the benefit of this disclosure.

A semiconductor structure in accordance with the invention, including an access transistor, is described below in terms of some steps that may be used to fabricate an illustrative embodiment.

4.1 Substrate Preparation

FIG. 1: An array area 100 for multiple semiconductor structures, e.g., DRAM cells, is to be implanted and the implant species is to be driven to a depth of about 0.25 microns to 0.5 microns on a substrate 105. As shown in the top view of FIG. 1(c), the array area 100 is doped with a conventional $N^+$ dopant such as arsenic or phosphorus, while the area of the substrate 105 outside the array area 100 is doped with a conventional $P^-$ dopant such as boron. (With the benefit of this disclosure, those of ordinary skill will appreciate that this configuration can be reversed, i.e., the array area can be doped with a $P^+$ dopant and the outside area with an $N^-$ dopant, with suitable changes being made in the fabrication process described below.)

4.2 Fabrication of Digit lines

FIG. 2: An intermediate oxide layer shown as 205 is formed on the substrate 105 and a trenched area 210 is etched. The intermediate oxide layer portions and the N+ substrate beneath those portions, shown as reference numeral 215, define the digit lines (also known as bit lines) of the array area. The trenched areas 210 will be filled and used as isolation structures as discussed in more detail below.

The intermediate oxide layer 205 may be formed by a variety of well-known deposition techniques such as chemical vapor deposition of TEOS (tetraethylorthosilicate) or NO (nitrous oxide), and the like. Alternatively, the intermediate oxide layer 205 may be thermally grown on the substrate 105 provided that appropriate precautions are taken to avoid oxidation of the $N^+$ dopant in the array area 100.

A photoresist (not shown) is applied in a photolithography masking process and a dry anisotropic etch (sometimes known as a plasma etch) is performed to produce the trenched area 210. As shown in FIG. 2(a), the trenched area is etched into the silicon to a depth of approximately 0.15 to 0.4 microns. Following the etch, the photoresist is stripped. The digit lines 215 may extend outside the array area 100 into the P⁻ portion of the substrate 105 to avoid shorting adjacent digit lines together. At this stage the oxide layer 205 may be removed if desired.

4.3 Strap-Like Conductive Spacer

FIG. 3: A refractory material 305 is conformally deposited to a thickness in the range of 500 Å to 1000 Å on the sides of the digit lines 215 after the process steps illustrated in FIG. 2(a). The refractory material 305 can be, e.g., a metal such as tungsten, cobalt, titanium, tantalum, or other suitable material that can withstand the temperatures used in the fabrication process. The refractory material is anisotropically etched with a reactive ion etch (RIE) to remove the material in the vertical direction only as shown in FIG. 3(a). The refractory material 305 thus becomes a strap-like conductive spacer.

FIG. 4: A dry anisotropic RIE etch is performed in the trenched area 210 to etch another 0.3 to 0.5 micron trenched area 405 into the doped-substrate array area 100. It will be appreciated by those of ordinary skill that the desired depth of the intermediate oxide layer 205, deposited as described above, will vary with the selectivity of the etch chemistry and the depth of the trenched area 405 being etched. As a result, the digit line 215 has a step-like sidewall 415, the upper portion of which is covered by the refractory material 305. The bottom of the trenched area 405 is then ion-implanted with a P-type material such as boron (using, e.g., a 25 keV implant in a dose ranging from $1 \times 10^{12}$ ions/cm² to $5 \times 10^{12}$ ions/cm²) to form a channel stop 410.

Figure 5:
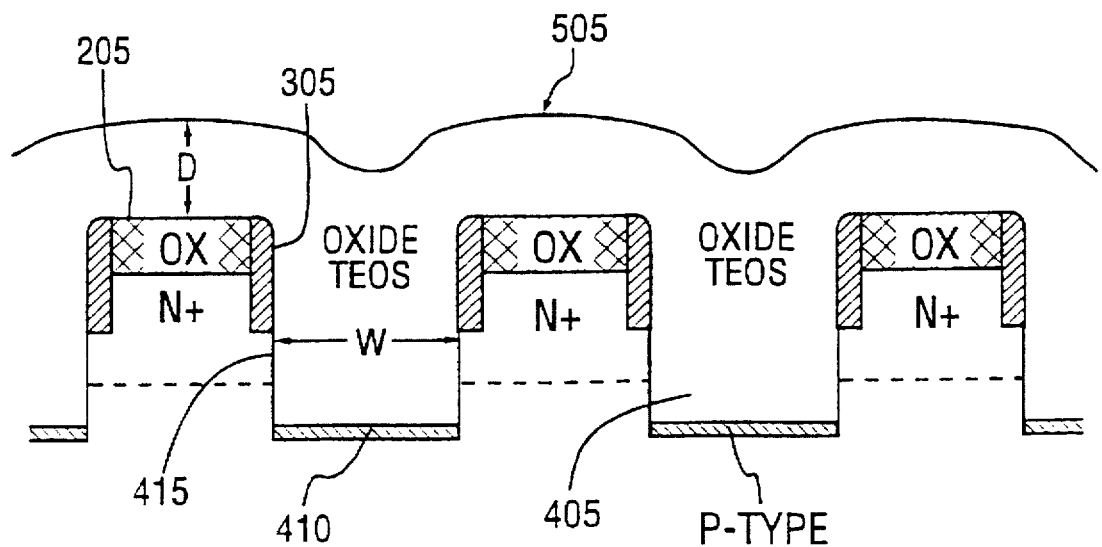
Figure 6:
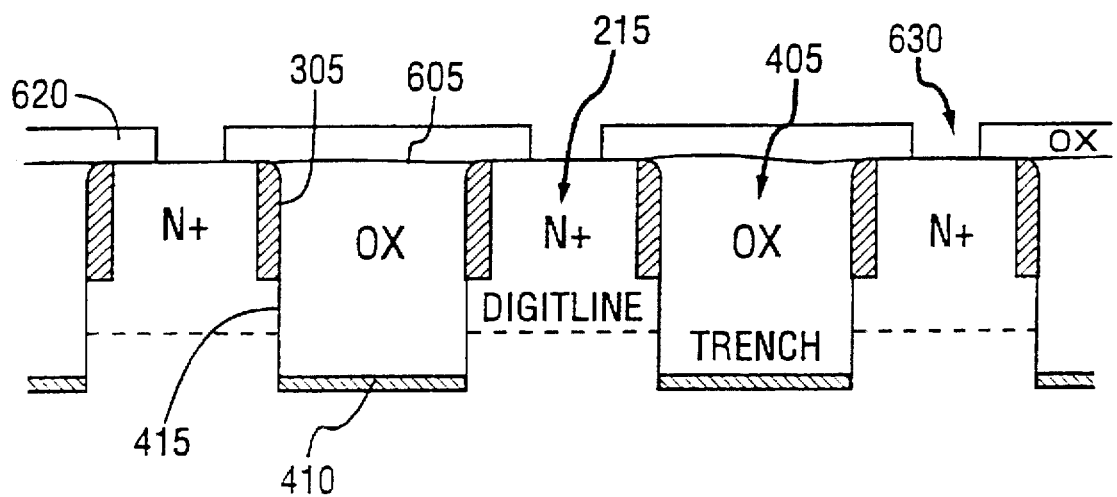

FIGS. 5, 6: The trenched area 405 is conventionally filled with a conformal deposition of a dielectric such as TEOS, shown as reference numeral 510. Typically, the trenched area will be somewhat overfilled to the level identified with reference numeral 505 and planarized using an etch or a chemical-mechanical planarization (CMP) back to a desired depth, e.g., to the level of the surface 605. As a result, the oxide layer 205 is removed from the digit lines 215, and the digit lines 215 are separated by trenches (reference numeral 405 is used hereafter to identify the filled trench).

After the planarization has occurred, another oxide layer 620 may be deposited on the substrate and then contact openings 630 formed as shown in FIG. 6. Alternatively rather than depositing oxide layer 630, the after planarization oxide surface level 605 may be left at a depth equivalent to the top of the oxide layer 620 and the contact openings then formed.

Figure 5A:
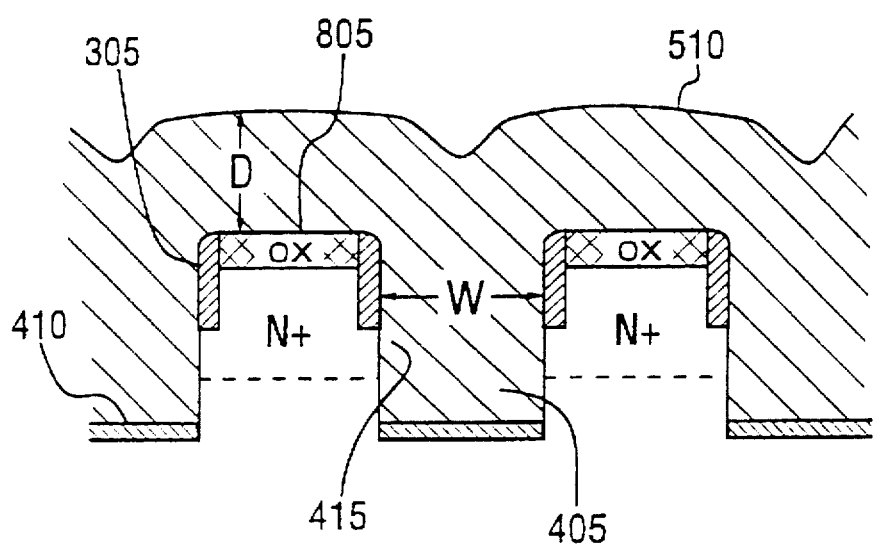
FIGS. 5A and 6A (showing an alternative implementation.
Figure 6A:
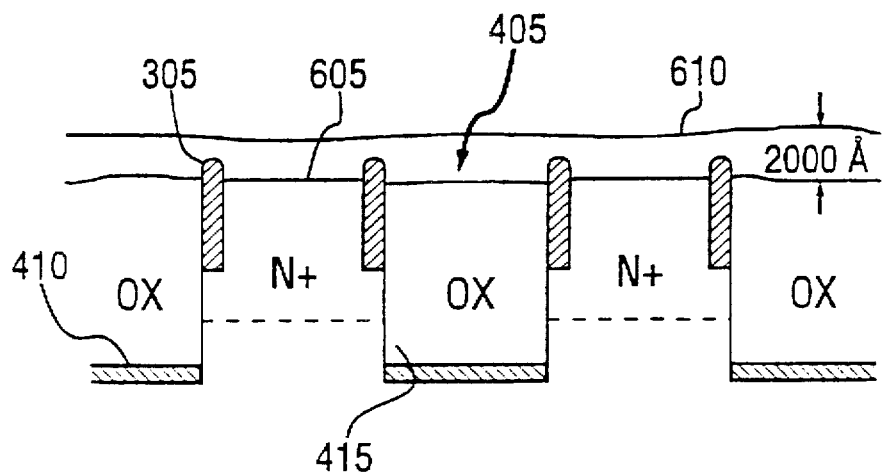

FIG. 5A shows an alternative embodiment in which a comparatively thick layer 510 of a TEOS insulating oxide layer is deposited on the substrate. As shown in FIG. 6A, the depth of the insulating oxide layer is then reduced to that shown as reference numeral 610.

4.4 Epitaxial Layer for Vertical Transistor and Capacitor

FIG. 7: An epitaxial layer 705, e.g., of silicon doped with a P⁻ dopant at a concentration in the range of $10^{15}$ atoms/cc to $10^{16}$ atoms/cc, is deposited on the substrate 105 to achieve a thickness t of approximately 0.6 to 1.2 microns, preferably 0.8 to 1.2 microns. The epitaxial layer is subsequently patterned with a photoresist 710 and anisotropically dry-etched to leave pillar-like word lines (identified for convenience by reference numeral 705) which are perpendicular to the digit lines 215 as shown in FIGS. 7(b) and 7(c). The photoresist 710 is then removed using conventional techniques. This epitaxial layer serves as the foundation for a vertical transistor as discussed below.

Figure 7A:
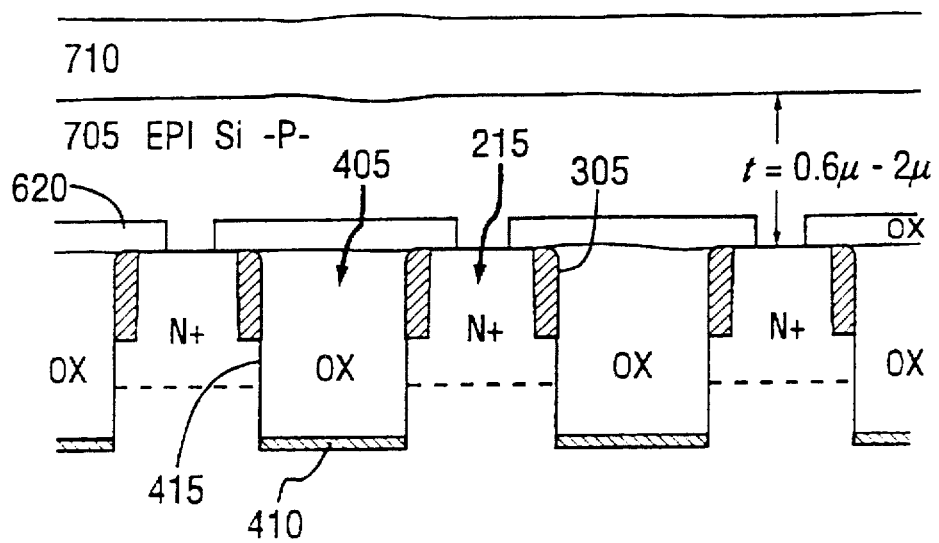
FIGS. 7(a), 7(b), 7(c), 7(d), 7(e), and 7(f) (where the latter three figures correspond to FIGS. 7(a), 7(b) and 7(c) in an alternative implementation)
Figure 7B:
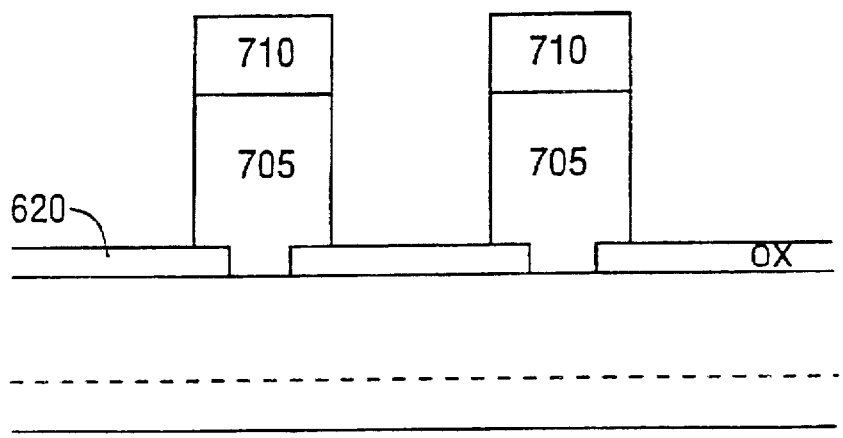
Figure 7C:
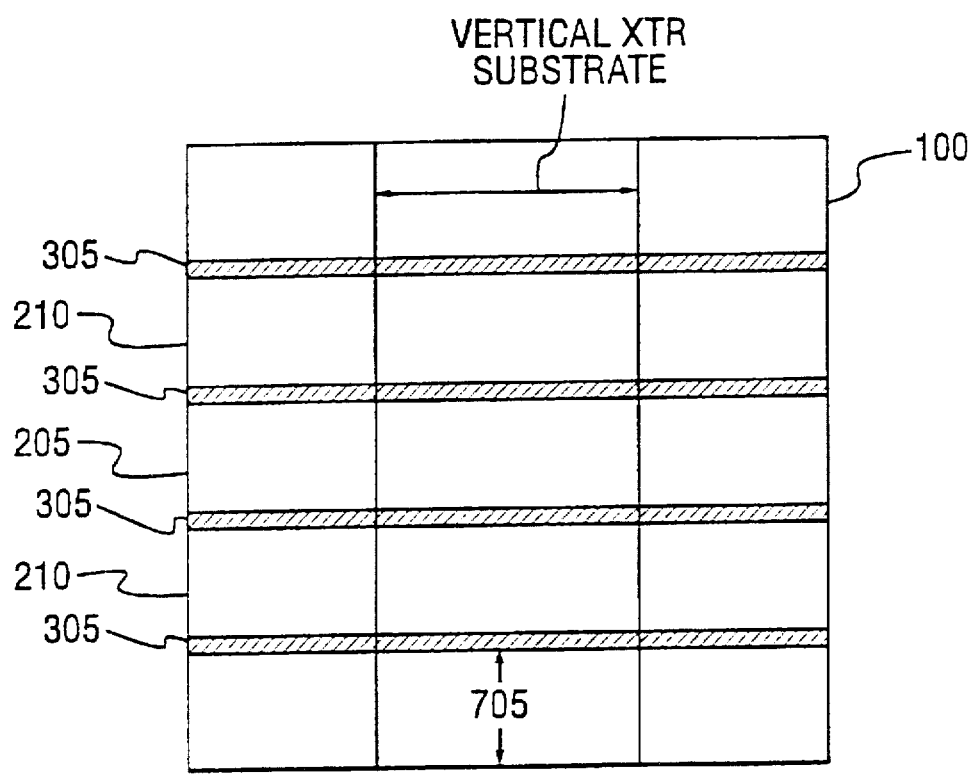
Figure 7D:
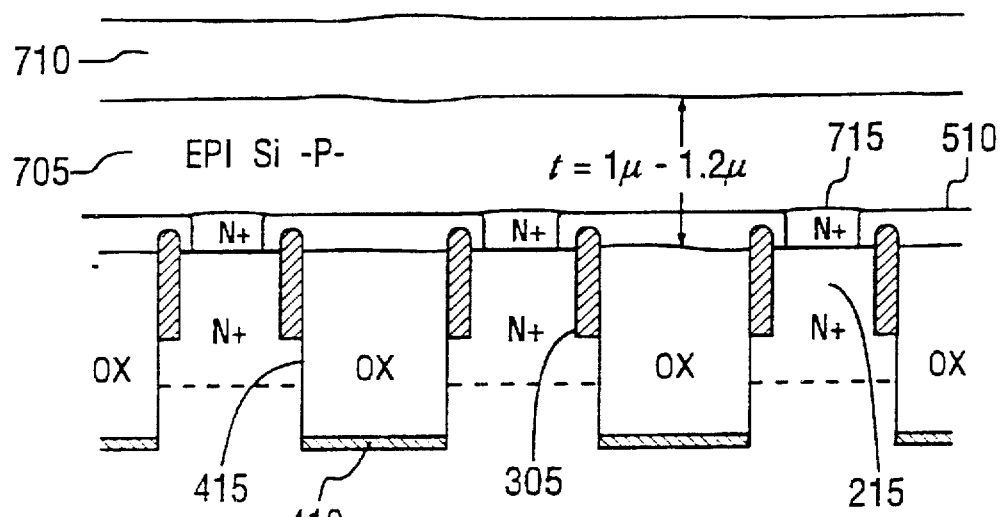
Figure 7E:
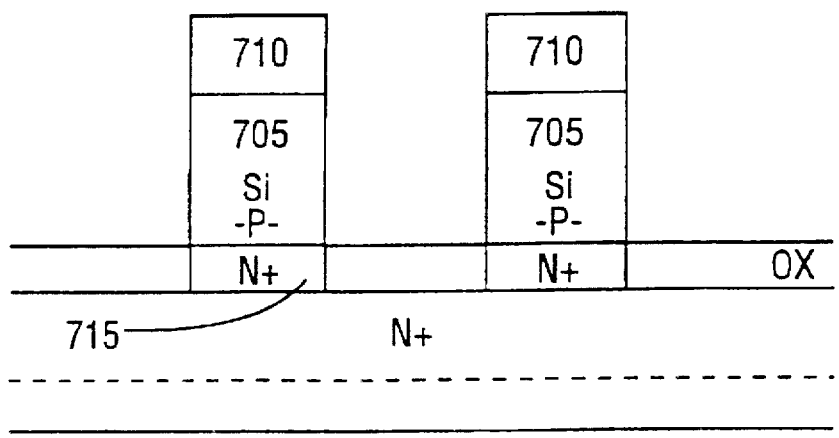
Figure 7F:
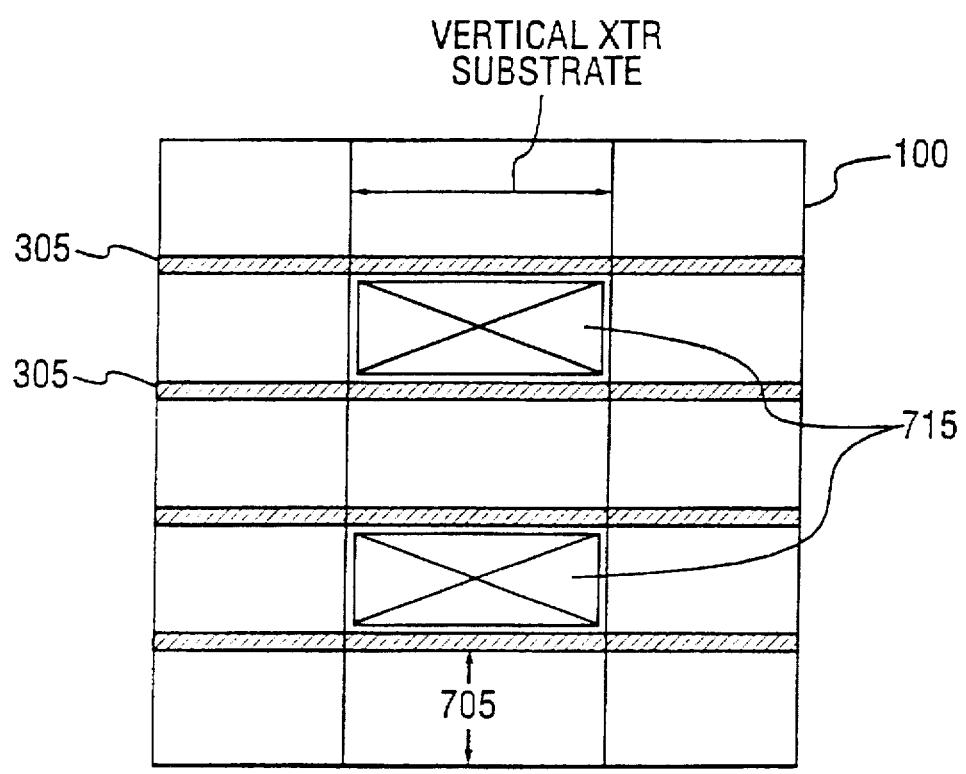
Figure 8A:
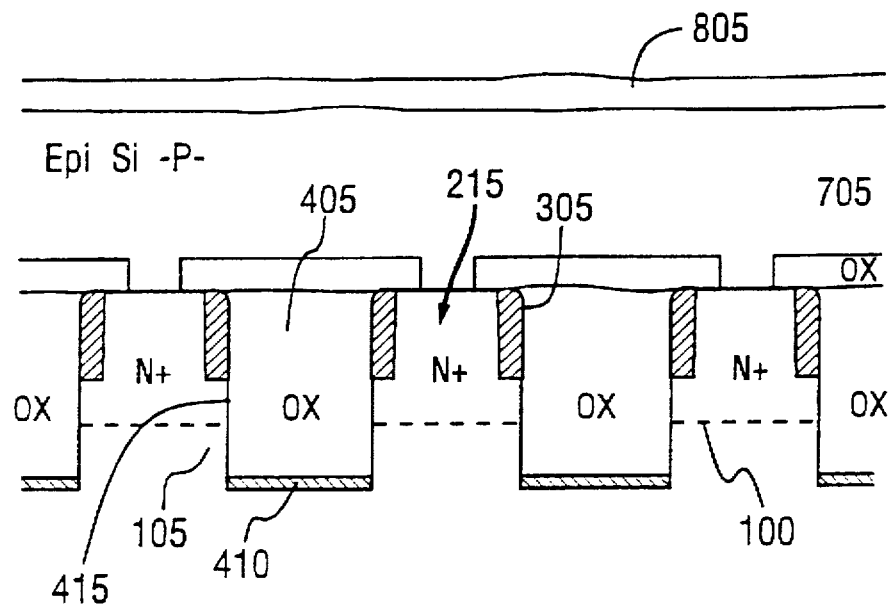
FIGS. 8(a) and 8(b) and, in an alternative implementation, FIGS. 8(d) and 8(e) (for consistency, FIG. 8(c) is not used)
Figure 8B:
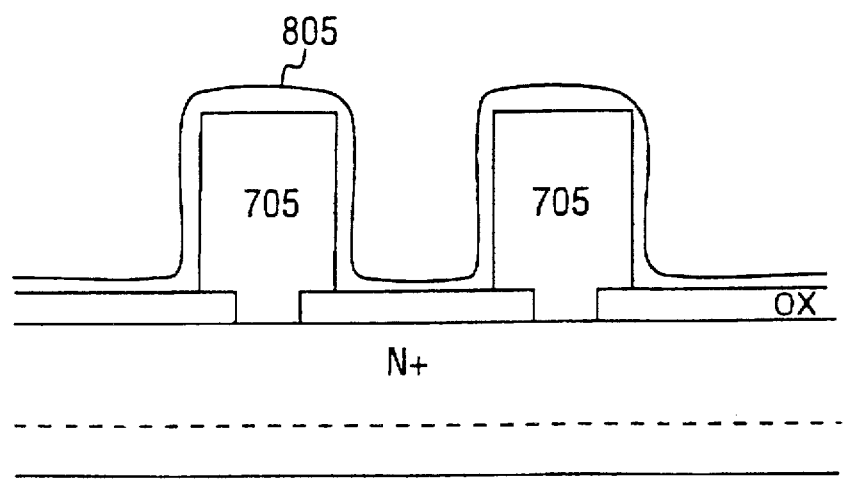
Figure 8D:
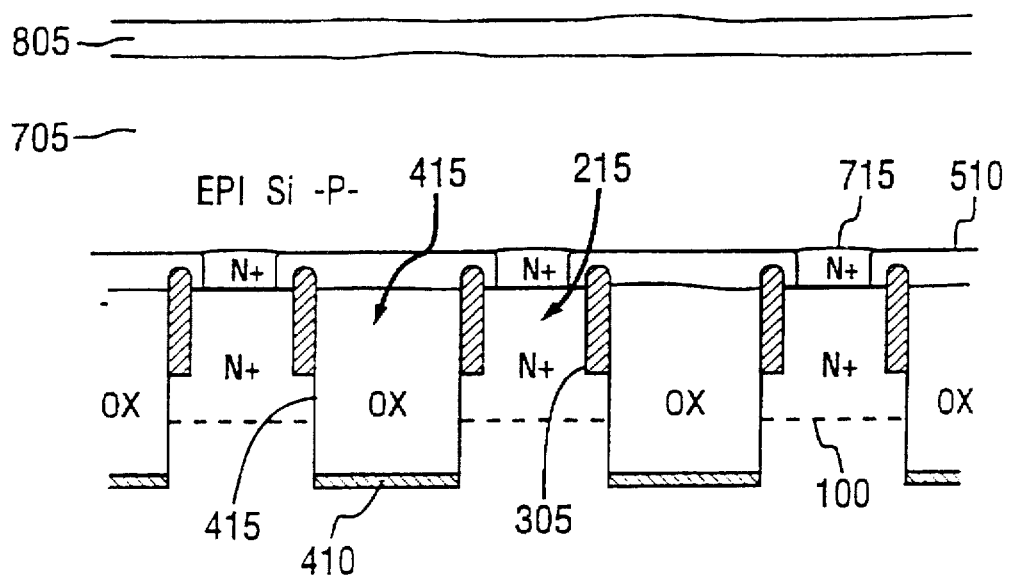
Figure 8E:
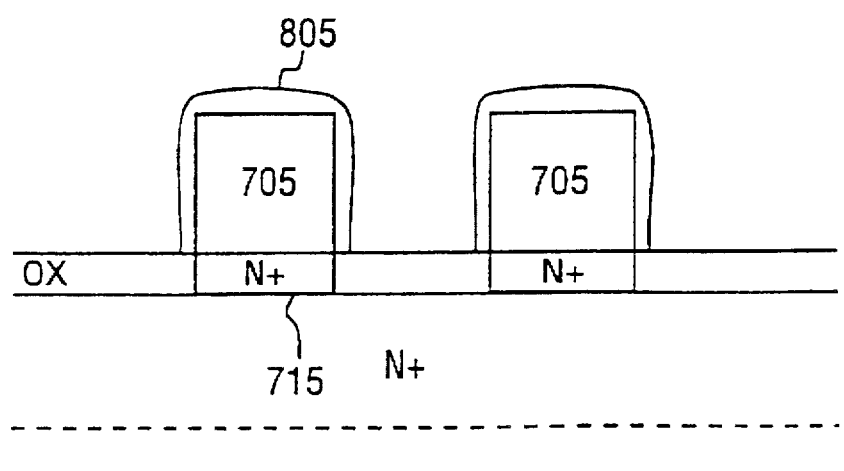

As shown in the alternative embodiments in FIGS. 7d and 7e, the oxide 205 over the N⁺ digit line is removed with a RIE etch patterned to create contact openings above the digit lines 215. Subsequently, the contact openings are filled with a selective epitaxial silicon layer 715 that is doped N⁺. The oxide layer 510 is left remaining above trench area 405. Epitaxial layer 705 and photoresist 710 are then deposited and patterned as described above. Though shown as centered in FIG. 7(d), the contact opening portion 715 can be positioned off-center so that it can favor a one-sided transistor action.

FIG. 8: A first portion 805 of an insulator oxide layer is thermally grown on the word lines 705. An angled implant for adjustment of threshold voltage $V_T$ can be applied in the usual manner. The first portion may be in the range of 100 Å to 500 Å, depending on the trade-offs desired in the particular implementation characteristics, e.g., speed of deposition, desired capacitance, and the like. The alternative embodiment discussed above in connection with FIGS. 5A and 6A and FIGS. 7(d), (e), and (f) is shown at this stage in FIGS. 8(d) and 8(e) and in FIG. 9A.

(Alternatively, the oxide could be deposited so that on opposite sides of the word line 705 the oxide layer 805 is comparatively thick and comparatively thin respectively. This allows the transistor being formed to operate on one side only of the device, thus reducing the chance that the depletion regions on opposite sides of the word line will overlap.)

Figure 9:
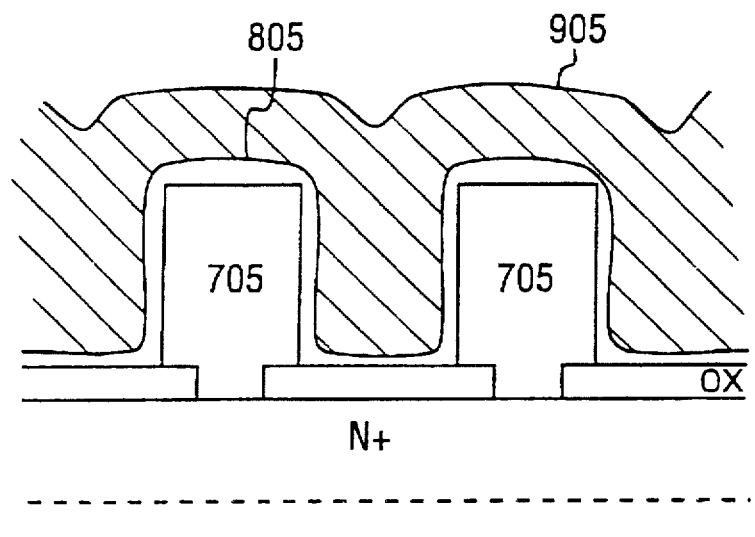
FIGS. 9 and 9A.
Figure 9A:
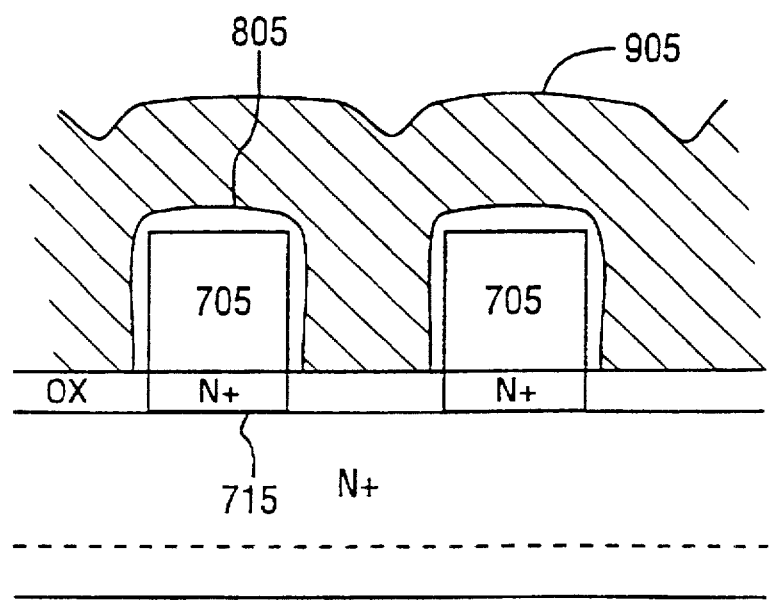
Figure 10:
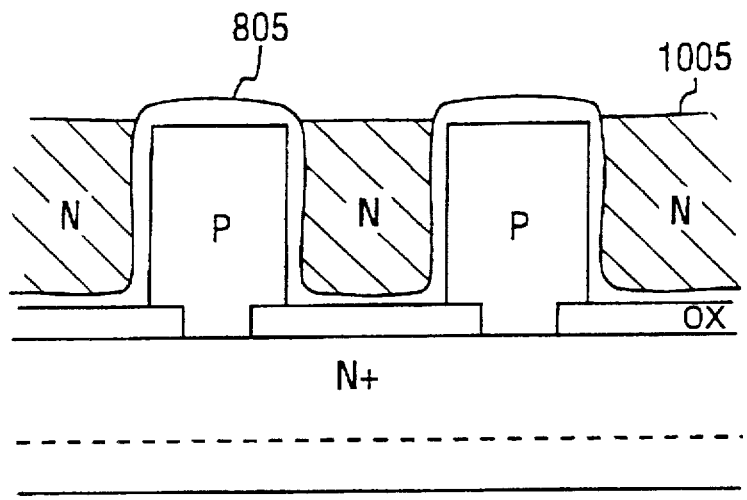
FIGS. 10, 11, 12 (showing one implementation)

FIGS. 9, 10: A polysilicon layer is conformally deposited on the substrate 105, shown as reference numeral 905. The polysilicon layer is doped in situ with an N⁻ dopant such as arsenic or phosphorus to a concentration in the range of $10^{20}$ to $10^{21}$ atoms per cubic centimeter. The polysilicon layer is planarized using an RIE etch or a chemical-mechanical planarization to the level of the insulator oxide layer 805, shown as reference numeral 1005.

Figure 10A:
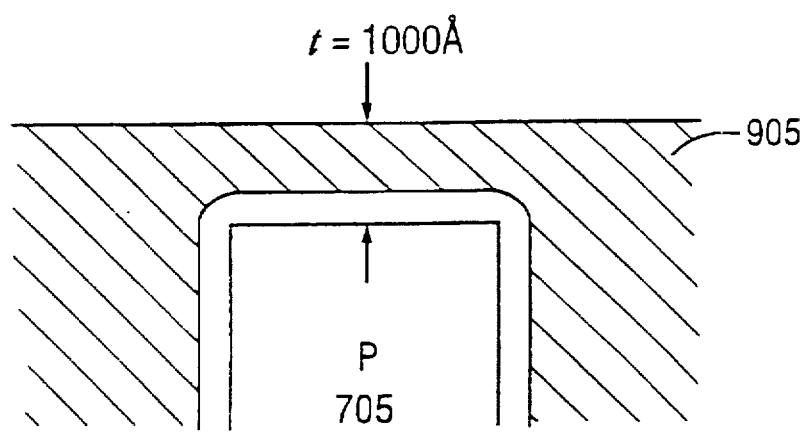
FIGS. 10A, 11A, and 12A (showing an alternative implementation)

(In an alternative implementation, the polysilicon planarization can be stopped at a suitable thickness above the word line 705 as shown in FIG. 10(a). The polysilicon is then oxidized as shown in FIG. 11(a) to form an oxide layer that is approximately 2,000 Å, after which an opening 1205 is formed as described below.)

Figure 11:
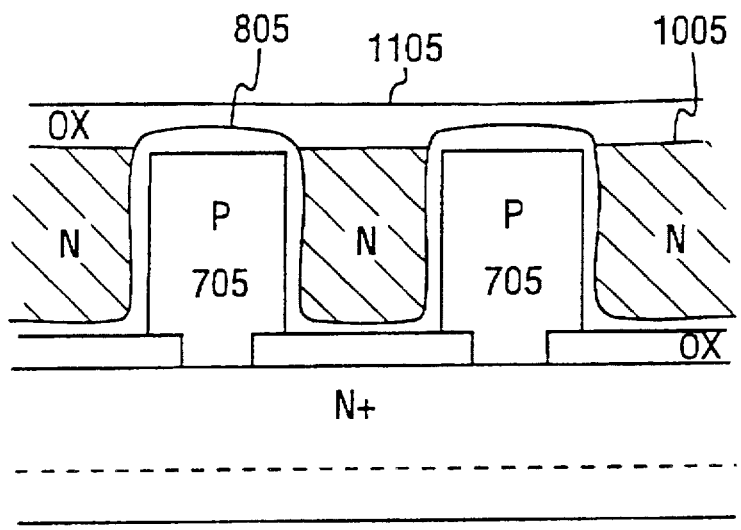
Figure 11A:
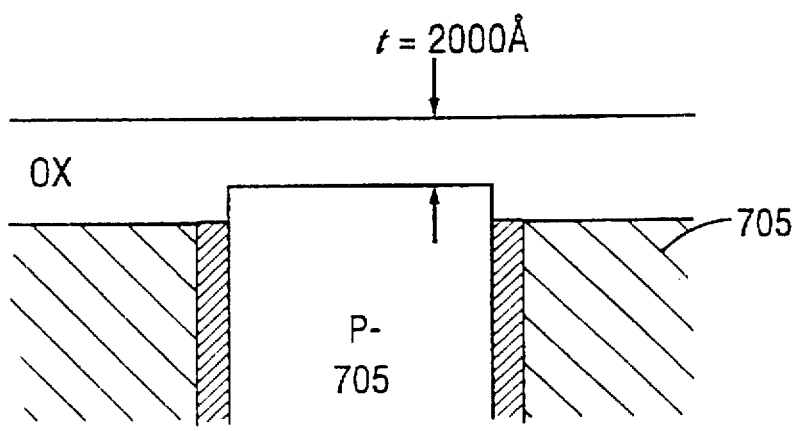

FIG. 11: A second portion 1105 of the insulator oxide layer is deposited to a thickness in the range of 2,000 Å to 3,000 Å using chemical vapor deposition or other suitable method. The second portion 1105 functions as both an implant mask and an insulator for subsequent steps.

4.5 Storage Node

Figure 12:
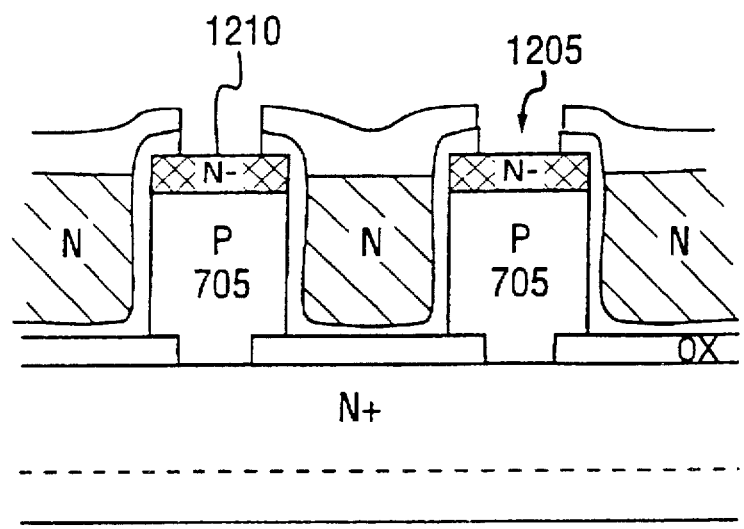
Figure 12A:
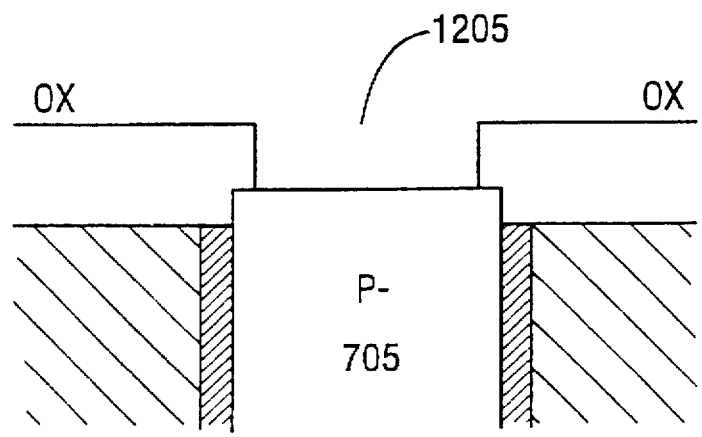
Figure 13B:
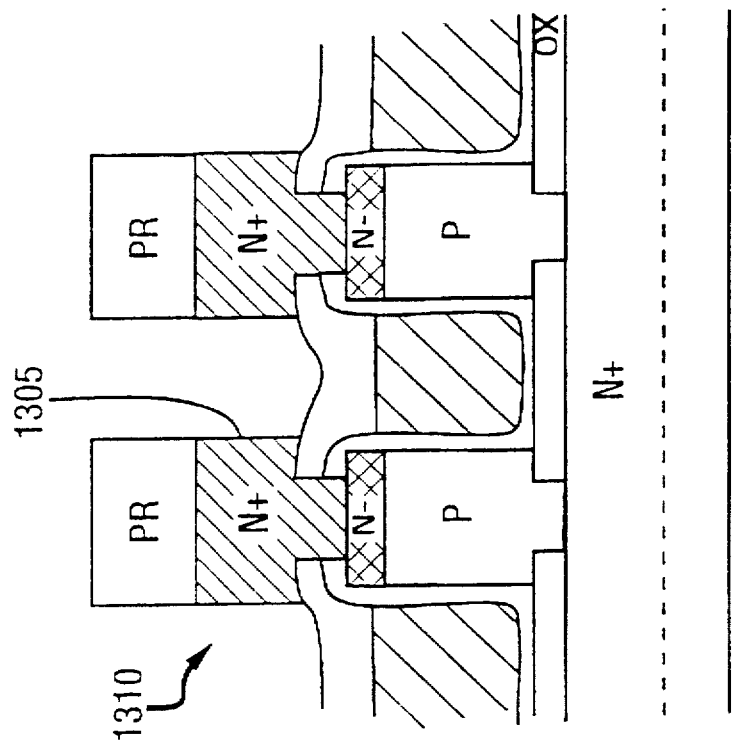
FIGS. 13(a), 13(b), and 13(c)
Figure 13A:
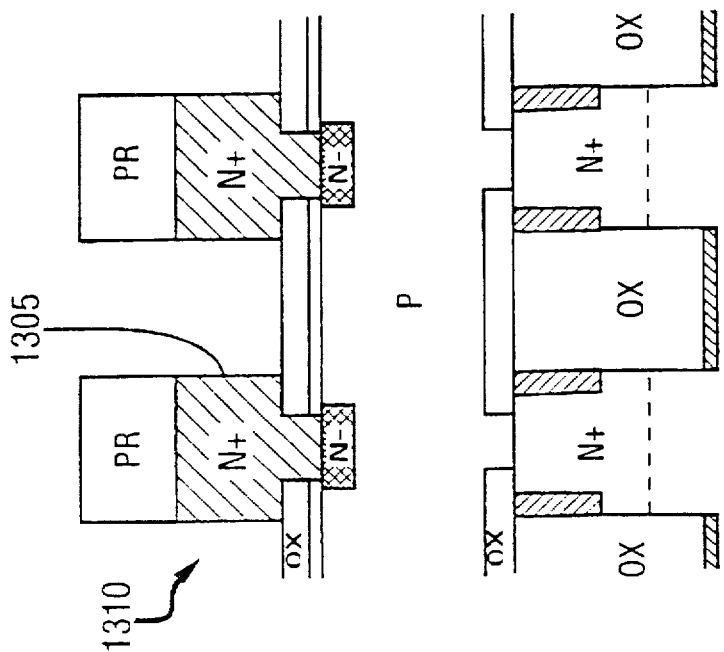
Figure 13C:
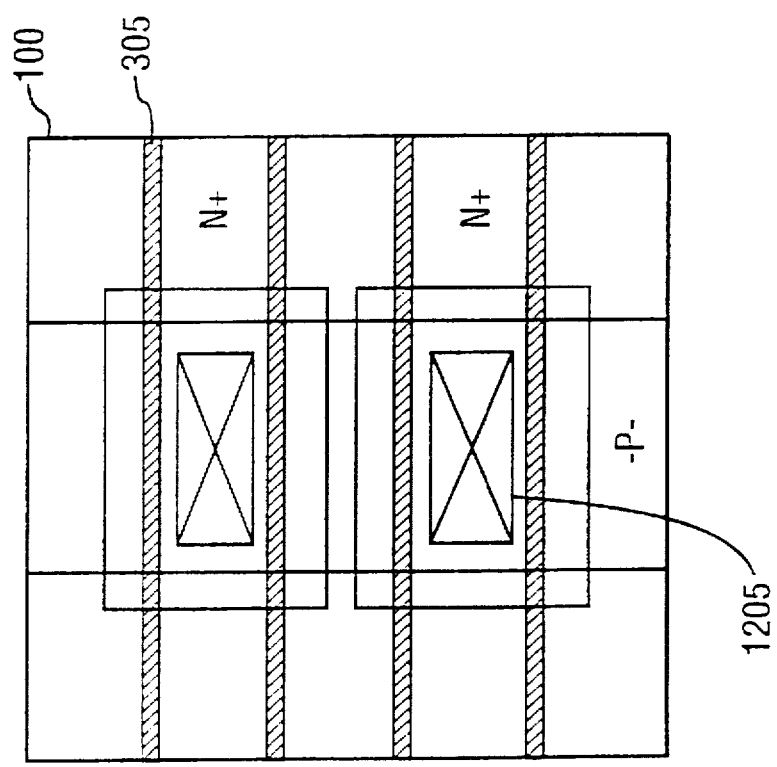

FIGS. 12, 13: Openings 1205 are etched through the first portion 805 and the second portion 1105 of the insulator oxide layer above each to serve as contact holes for the word lines 705. An N⁻ dopant material is implanted through the openings 1205 onto the word lines 705. A polysilicon layer is deposited on the substrate 105 with in-situ doping of an N⁺ material, followed by a patterned anisotropic etch. This results in the formation of a storage node 1310 having vertical sidewalls 1305. The desired shape and thickness of polysilicon layer 1310 will vary depending on the type of capacitor to be fabricated therein as discussed below. FIG. 12A illustrates the opening 1205 when the alternative implementation shown in FIGS. 10A and 11A is utilized. As noted above in connection with the contact opening portion 715, the openings 1205 can be positioned off-center so that they can favor a one-sided transistor action.

4.6 Reference Gate Region

Figure 14A:
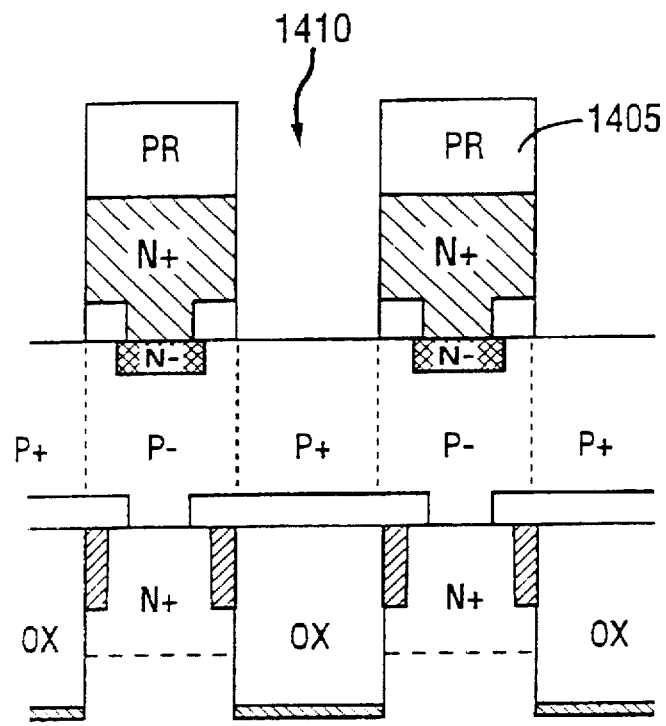
FIGS. 14(a) and 14(b)
Figure 14B:
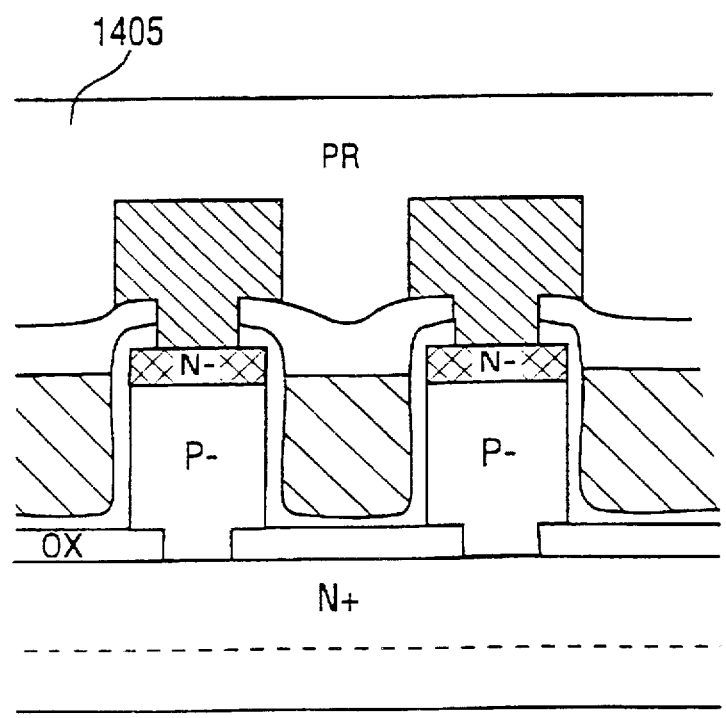

FIG. 14: A photoresist layer 1405 is coated on the substrate 105 and patterned as shown in FIGS. 14(a) and 14(b). The oxide in region 1410 is etched with an REI etch. After etch, a P+ implant is performed in region 1410. The P+ implant should not have so much lateral straggle that it will go too far into the P-minus region. The dose and energy of the P+ implant should be selected to (1) minimize lateral implant straggle, (2) minimize propagation delays in the word line, and (3) minimize storage node diode leakage; the P+ implant preferably will be a medium-energy implant in the range of 50 to 200 keV.

4.7 Capacitor

Figure 15:
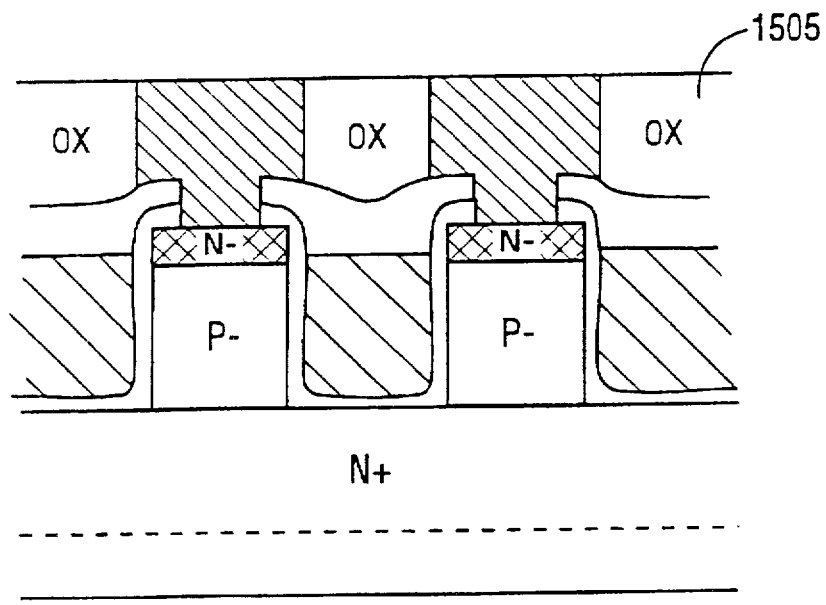
FIGS. 15, 16, 17, and 18.
Figure 16:
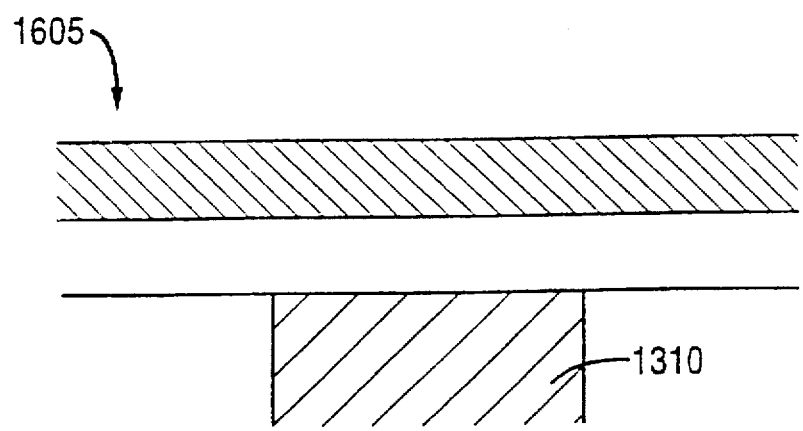
Figure 17:
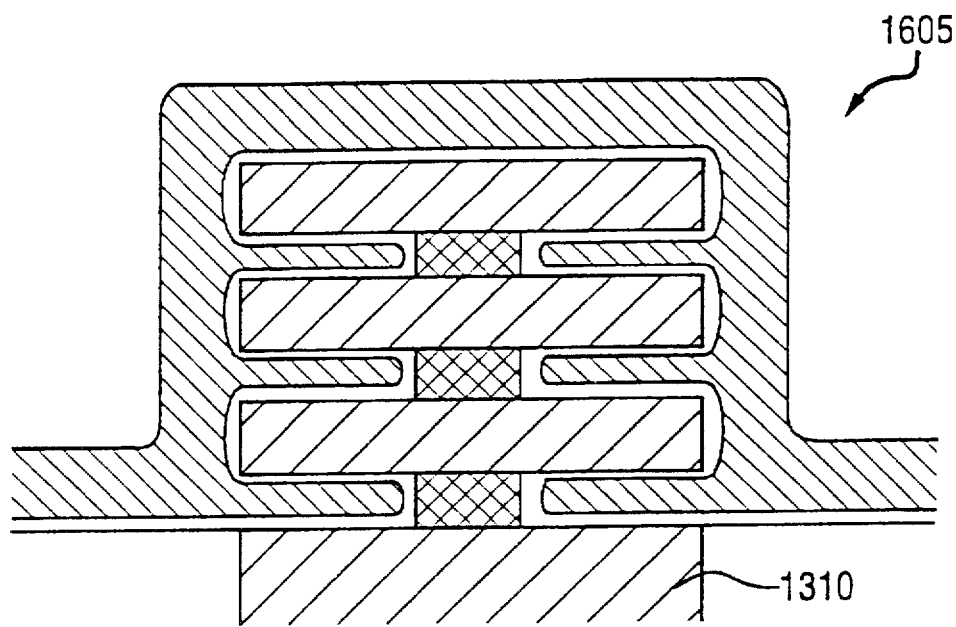
Figure 18:
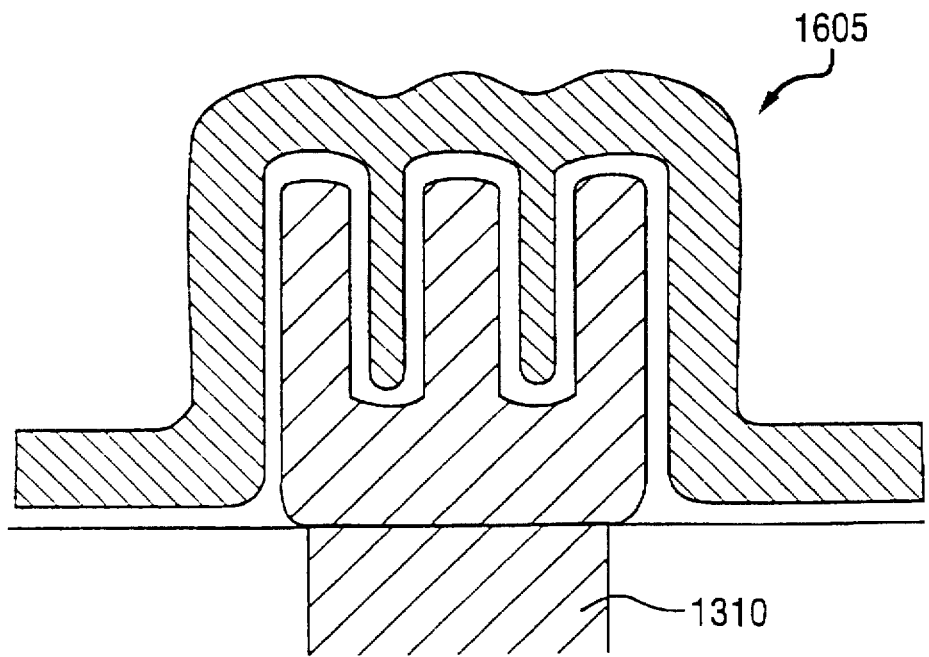

After the implant described above, an oxide 1505 fill and etchback planarization process is performed to produce the structure shown in FIG. 15. This constructs a flat platform on which a capacitor 1605 can be built. A variety of types of capacitors can be used; three representative capacitor types (planar, finned, and container) are shown for illustrative purposes in FIGS. 16 through 18. In addition to the structural variations shown in FIGS. 16 through 18, several dielectric materials are depicted ($TaO_5$, PZT, and ONO); virtually any standard dielectric may be used in the capacitor.

4.8 Array Schematic

Figure 19:
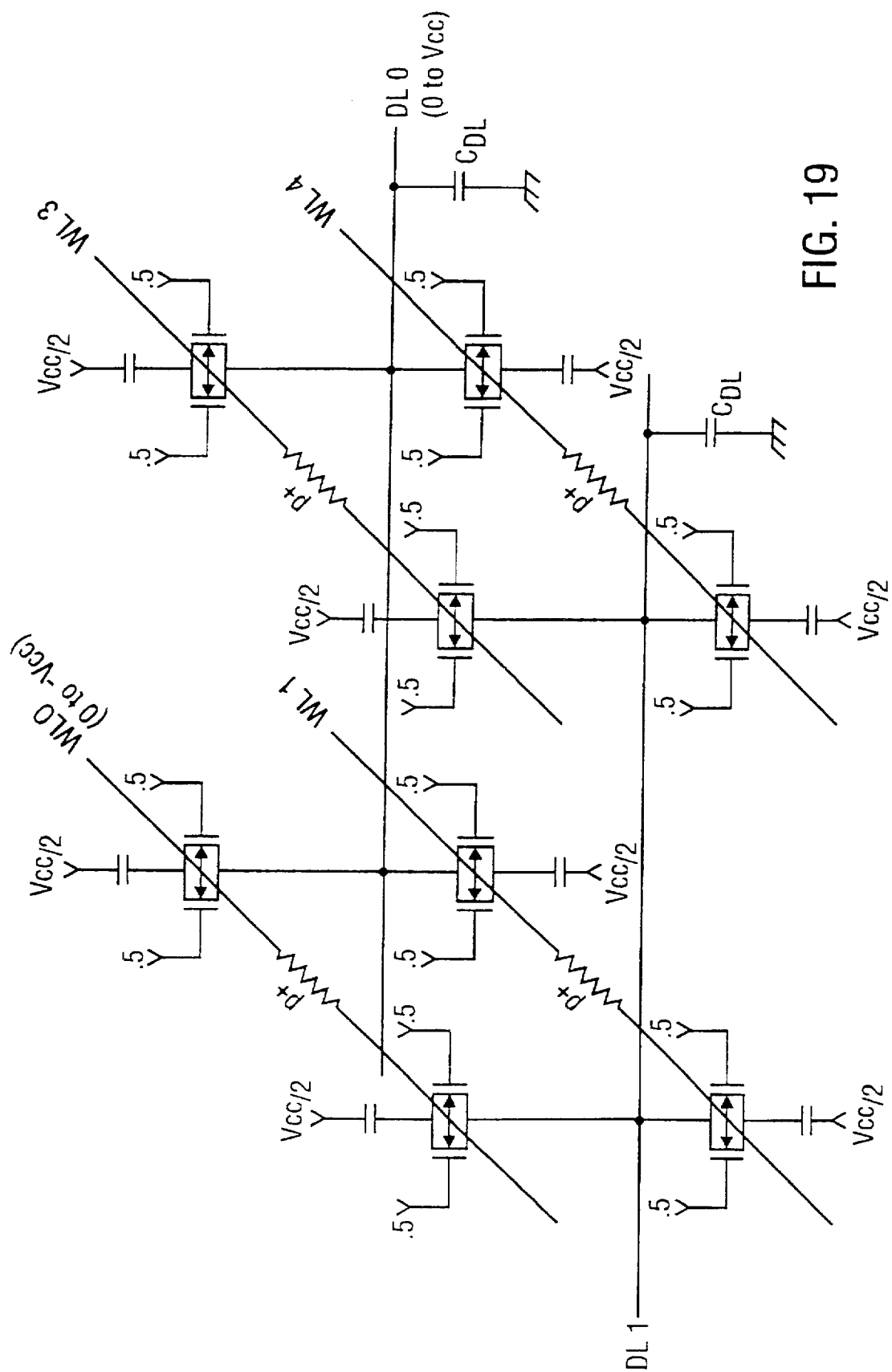
FIG. 19 is a schematic diagram showing one possible implementation of a cell array using a semiconductor structure in accordance with the invention.

The structure described above results in an array depicted schematically in FIG. 19. The wordlines WL1 through WL4 are composed of lines with alternating P+ and P− regions where the P− region is the substrate for the access transistor. In the Figure, two transistors are shown on each side of the array for two-transistor operation; as discussed above, however, a one-transistor operation may be favored by placement of the word line and/or the contact opening.

The top plate of the capacitor is common to all the cell capacitors. As shown in FIG. 19, each digit line has its own parasitic capacitance capacitor. The wordline voltage may range from 0 to −VCC, while the digit line voltage may range from 0 to VCC.

4.9 Operation of the Cell

In the device, the backbias voltage (Vbb) controls the turn-on voltage of the access transistor gate. A zero voltage on the backbias results in a lower turn-on voltage, while −5V on the backbias results in a higher turn-on voltage. Thus, Vbb=0 is the conductive state, while Vbb =−5V is the off state.

In the circuit, the access transistor gate potential is set to a voltage between 0.5V and 1.0V such that the VT of the device swings from below 0.5V to above 1.0V to ensure proper turning on and turning off of the access transistor; when Vbb=0V, VT is below that range.

The illustrative structure permits a cell to be fabricated with a comparatively low number of masks. For example, the alternative processes described above require four and five masks respectively. In addition, the use of a buried digit line eliminates the need for double-level metal. Moreover, because the poly gate is a CMP poly layer, this further eliminates the need for a poly gate masking layer. The vertical nature of the transistors described above permits longer transistor lengths for comparable transistor densities, thus reducing the likelihood of short-channel transistor effects.

A vertical transistor acting as an access transistor gate to the DRAM cell capacitor does require that the access current charge leakage through the access gate claimed to be less than 0.1 pA when the transistor is shut off. On the other hand, the DRAM access transistor does not need to be a high drive device so that the turn-off voltage of the access gate can be higher than the periphery devices, thus allowing for better shut-off.

The illustrative embodiments described above use the body of the transistor as the controlling element in the transistor. The epitaxial silicon which becomes the substrate of the vertical access device will have the backbias potential $V_{BB}$ that sets the threshold voltage $V_T$ of the device. The more negative backbias voltage $V_{BB}$ will give a higher threshold voltage $V_T$. For instance, by setting the polysilicon gate side of the transistor to a set gate-to-source potential $V_{GS}$ such as 1.0V, then the backbias voltage $V_{BB}$ can turn on the device with a threshold voltage $V_T$=0.5V when the backbias voltage $V_{BB}$=0V. Thus the source potential $V_{GS}$ exceeds the threshold voltage $V_T$, and the device is conductive. Then the backbias voltage $V_{BB}$ can turn off the device with a threshold voltage $V_T$=1.5V at a backbias voltage $V_{BB}$=−3V so that the threshold voltage $V_t$ exceeds the source potential $V_{GS}$ to produce a non-conductive state.

Figure 12B:
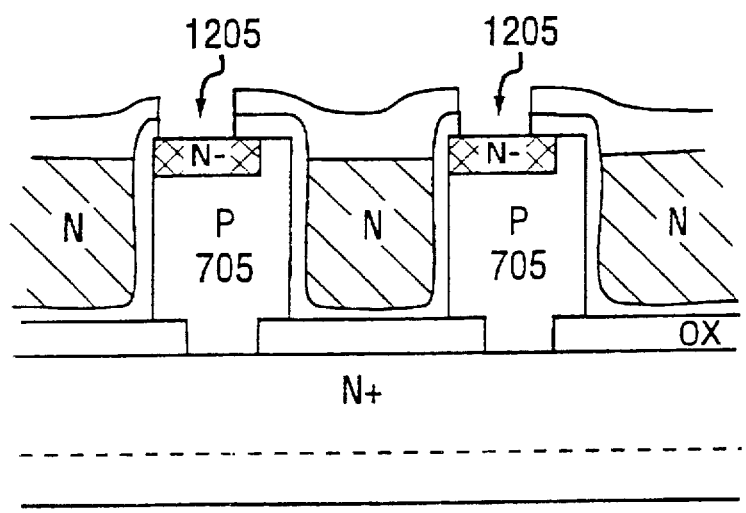
FIG. 12B (showing another alternative implementation)
Figure 20:
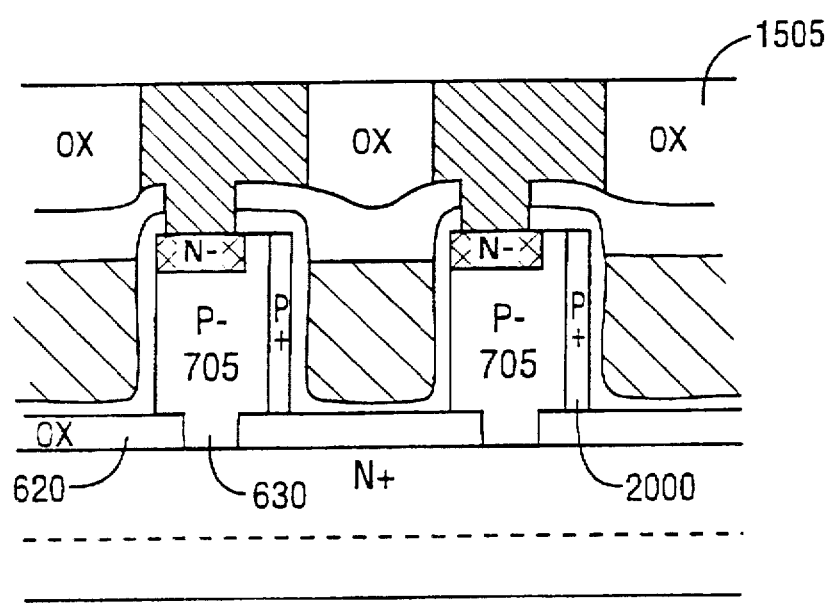
FIG. 20 (showing yet another alternative implementation).

The amount of charge necessary to set the backbias voltage $V_{BB}$ is selected to conduct readily to all the string of parallel rowline transistors. The backbias voltage $V_{BB}$ needs to reach its potential to turn on the access gate in time as the digitlines are sensed as the cell capacitor charge is dumped into the digitline. To improve the ability to send the $V_{BB}$ potential across the rowline, the epitaxial silicon layer has P+ regions between cells. The P+ lowers the resistance and also improves the isolation between the cells. Also, the P+ must not intersect the storage mode diode so that the diode leakage must be maintained at the lowest level. The level of the resistance will dictate how much current drive the rowline drivers will need to supply which means that the size of rowline drivers would be increased. In a one-sided embodiment such as described above (see for example FIG. 12B, the P+ can be also incorporated on non-active side of the vertical transistor (see FIG. 1) so that the P+ would be continuous throughout the rowline. For example, FIG. 20 illustrates a continuous P+ area 2000 incorporated into the rowline. In such an embodiment, it may be desirable to offset contact 630 in oxide 620 such as shown in FIG. 20 to ensure that contact 630 does not overlap with P+ region 2000.

4.10 Some Possible Applications of the Semiconductor Structure

The vertical-gate transistor described above can be used not only in conjunction with a capacitor in a DRAM, but in a wide range of devices in which a vertical access transistor and a cross-point array configuration would be desirable. For example, an antifuse device can be constructed above the storage node diode depicted in the illustrative embodiment. In addition, a programmable resistor device can be constructed in a similar manner.

4.11 Some Advantages of the Invention

A vertically-integrated semiconductor structure in accordance with the present invention permits the number of transistors to be increased by approximately a factor of three for the same surface area. In a DRAM, for example, a given transistor density is achievable with much wider tolerances in photolithography and thus at significantly lower cost. Vertical integration is considerably easier using the techniques described above, and allows a wider variety of capacitor designs, including capacitors based on ferroelectric properties.

The illustrative semiconductor structure has very good static refresh characteristics. The time between refresh cycles is advantageously increased because of the reduced leakage from the storage node 1310 to the silicon substrate 104. For the same reason, the illustrative semiconductor structure also has excellent standby current characteristics.

It will be appreciated by those of ordinary skill having the benefit of this disclosure that numerous variations from the foregoing illustration will be possible without departing from the inventive concept described herein. Accordingly, it is the claims set forth below, and not merely the foregoing illustration, which are intended to define the exclusive rights claimed in this application program.

What is claimed is:

1. A semiconductor structure comprising:
   (a) a silicon substrate;
   (b) a plurality of parallel digit lines formed on the substrate and separated from each other by isolation structures,
      (1) each said digit line comprising an $N^+$ dopant;
      (2) each said isolation structure comprising a trench filled with a dielectric, a bottom of said trench being implanted with a P-type channel stop,
      (3) each said digit line including at least one step-shaped sidewall formed adjacent said trench, at least a portion of said at least one sidewall being covered by a refractory material comprising tungsten, cobalt, titanium, or tantalum;
   (c) a silicon epitaxial layer formed on said plurality of digit lines, said epitaxial layer being referred to as a word line and comprising:
      (1) a region above said digit line that comprises a $P^-$ dopant at a concentration in the range of $10^{15}$ atoms/cc to $10^{16}$ atoms/cc, referred to as a $P^-$ region;
      (2) a storage node comprising a region of $N^-$ dopant formed into an uppermost surface of said epitaxial layer, referred to as an $N^-$ region
      (3) a region above and adjacent said digit line that comprises a $P^+$ dopant at a concentration from about $10^{20}$ atoms/cc to about $10^{21}$ atoms/cc, referred to as a $P^+$ region
   (d) an insulator region formed on an uppermost surface of said epitaxial layer, said insulator region having an opening to said $N^-$ region;
   (e) a reference gate comprising a reference polysilicon region, said insulator region extending between said reference polysilicon region and said epitaxial layer; and
   (f) a capacitor formed on said epitaxial layer, said capacitor comprising:
      (1) a finned first polysilicon region formed on said insulator region and said $N^-$ region;
      (2) a dielectric material formed on said polysilicon region; and
      (3) a second polysilicon region formed on said dielectric material.

2. The semiconductor structure of claim 1, further comprising a dielectric layer formed between said epitaxial layer and said plurality of digit lines.

3. A semiconductor structure comprising:
   (a) a substrate formed from a semiconducting material;
   (b) a plurality of parallel conductive lines formed on the substrate and separated from each other by isolation structures, said conductive lines being referred to as digit lines;
      (1) each said isolation structure comprising a trench filled with a dielectric,
      (2) a bottom of said trench being implanted with a p-type channel stop, and
   (c) an epitaxial line formed on and perpendicular to said plurality of digit lines, said epitaxial line being referred to as a word line and comprising a storage node; and
   (d) a polysilicon gate formed at each junction of said epitaxial line and said plurality of digit lines.

4. The semiconductor structure of claim 3, further comprising a capacitor formed on said epitaxial line.

5. The semiconductor structure of claim 3, further comprising means for lowering the resistance of the digit line.

6. The semiconductor structure of claim 3, wherein said digit line includes at least one sidewall formed adjacent said trench.

7. The semiconductor structure of claim 6, wherein said at least one sidewall has a stepped shape.

8. The semiconductor structure of claim 6, wherein a portion of said at least one sidewall is covered by a refractory metal material that does not decompose at semiconductor fabrication temperatures.

9. The semiconductor structure of claim 8, wherein (i) said sidewall has a ledge and (ii) said refractory metal material is formed on said ledge.

10. The semiconductor structure of claim 3, wherein said digit line comprises an $N^+$ dopant.

11. The semiconductor structure of claim 3, wherein said epitaxial line comprises a silicon layer, said silicon layer including a region above said digit line that comprises a $P^-$ dopant, referred to as a $P^-$ region.

12. The semiconductor structure of claim 11, wherein said $P^-$ dopant forms a concentration in a range of $10^{15}$ atoms/cc to $10^{16}$ atoms/cc.

13. The semiconductor structure of claim 11, wherein said silicon layer further includes a region above and adjacent said digit line that comprises a $P^+$ dopant, referred to as a $P^+$ region.

14. The semiconductor structure of claim 13, wherein said $P^+$ dopant forms a concentration in a range of $10^{20}$ atoms/cc to $10^{21}$ atoms/cc.

15. The semiconductor structure of claim 3, wherein (1) said epitaxial line forms a part of a vertical transistor, and (2) said digit line forms a drain of said vertical transistor.

16. The semiconductor structure of claim 3, wherein said storage node comprises a region of $N^-$ dopant formed into an uppermost surface of said epitaxial line, referred to as an $N^-$ region.

17. The semiconductor structure of claim 16, further including a capacitor that comprises:
   (1) an insulator region formed on an uppermost surface of said epitaxial line, said insulator region having an opening to said $N^-$ region;
   (2) a first polysilicon region formed on said insulator region and said $N^-$ region;
   (3) a dielectric material formed on said polysilicon region; and
   (4) a second polysilicon region formed on said dielectric material.

18. The semiconductor structure of claim 17, wherein:
   (A) said reference gate comprises a voltage polysilicon region; and
   (B) said insulator region extends between said voltage-reference polysilicon region and said word line.

19. The semiconductor structure of claim 3, further comprises a dielectric layer formed between said epitaxial line and said plurality of digit lines.

20. An access transistor formed in a substrate, said access transistor comprising (a) a digit line formed in said substrate and functioning as a drain of said access transistor, (b) a word line, said word line being an epitaxial layer formed on said digit line and functioning as a vertical channel of said access transistor, and (c) a gate being formed of polysilicon disposed adjacent the word line.

* * * * *